US010892747B2

(12) United States Patent
Bernacchia et al.

(10) Patent No.: US 10,892,747 B2
(45) Date of Patent: *Jan. 12, 2021

(54) CIRCUITS, METHODS AND SYSTEMS FOR SETTING A CURRENT LEVEL TO BE USED BY A CURRENT-MODE GATE DRIVER

(71) Applicant: Infineon Technologies Austria AG, Villach (AT)

(72) Inventors: Giuseppe Bernacchia, Villach (AT); Adriano Sambucco, Villach (AT)

(73) Assignee: Infineon Technologies Austria AG, Villach (AT)

( * ) Notice: Subject to any disclaimer, the term of this patent is extended or adjusted under 35 U.S.C. 154(b) by 0 days.

This patent is subject to a terminal disclaimer.

(21) Appl. No.: 16/818,453

(22) Filed: Mar. 13, 2020

(65) Prior Publication Data
US 2020/0220531 A1   Jul. 9, 2020

Related U.S. Application Data

(63) Continuation of application No. 16/133,894, filed on Sep. 18, 2018, now Pat. No. 10,608,625.

(51) Int. Cl.
*H03K 17/06*   (2006.01)

(52) U.S. Cl.
CPC ... *H03K 17/063* (2013.01); *H03K 2217/0081* (2013.01)

(58) Field of Classification Search
CPC .............. H03K 17/063; H03K 2217/0018
USPC .............. 327/108, 109, 110, 111, 112
See application file for complete search history.

(56) References Cited

U.S. PATENT DOCUMENTS

| 5,225,720 A | 7/1993 | Kondoh et al. |
|---|---|---|
| 7,332,935 B2 | 2/2008 | Illegems et al. |
| 10,608,625 B1 * | 3/2020 | Bernacchia ............ H03K 17/14 |
| 2005/0024090 A1 * | 2/2005 | Terletzki .......... H03K 19/01707 326/87 |
| 2014/0293664 A1 | 10/2014 | Dai et al. |
| 2017/0033555 A1 * | 2/2017 | Taguchi ............. H02P 29/0241 |

FOREIGN PATENT DOCUMENTS

WO    2011149632 A2    12/2011

* cited by examiner

*Primary Examiner* — John W Poos
(74) *Attorney, Agent, or Firm* — Murphy, Bilak & Homiller, PLLC

(57) ABSTRACT

Circuits, methods, and systems are provided for setting a current level to be used by a current-mode gate driver. The current level may be used to source, sink, or both source and sink current to/from the gate terminal of a power device. The current level is based upon a current or voltage level input from an analog current-setting terminal. This input current or voltage level may take a value from a continuous range of current or voltage values.

20 Claims, 12 Drawing Sheets

CIRCUITS, METHODS AND SYSTEMS FOR SETTING A CURRENT LEVEL TO BE USED BY A CURRENT-MODE GATE DRIVER

TECHNICAL FIELD

The present application relates to a gate driver which provides a gate drive current having a continuously-variable current level based upon an analog input.

BACKGROUND

Gate driver circuits drive currents which are provided to control terminals (gates) of power devices. Examples of power devices that use such gate driver circuits include power metal-oxide semiconductor field-effect transistors (MOSFETs), insulated-gate bipolar transistors (IGBTs), gallium nitride (GaN) transistors, and silicon carbide (SiC) MOSFETs. The efficient use of power devices within practical applications requires that an appropriate drive current be provided by gate driver circuits to the power device gates.

Power devices perform most efficiently when they are fully on (e.g., saturated) or fully off (non-conducting). As a power device transitions between fully-on and fully-off states, the power device incurs switching losses that reduce efficiency. Switching losses may be minimized by limiting the transition time for a power device. This generally requires that a relatively large current be provided to a gate (control) terminal of a power device when turning the power device on, and that a large current be sunk from the gate (control) terminal when turning off the power device. High current levels quickly charge or discharge the gate capacitance of the power device, thereby limiting the time spent transitioning the power device between its fully-on and fully-off states. However, the gate drive current levels may not be increased without limit, as the power device is only capable of handling current below a certain level. Furthermore, generation of the drive current incurs its own losses, which must be traded off against the switch losses incurred during switch transitions.

A given power device typically has an optimal current gate drive level, and may have an acceptable range of current levels around the optimal level. The optimal current level and an associated acceptable range will vary from one power device to the next for the same power device design, due to process variations in manufacturing the power devices. For example, the channel width, channel length, gate capacitance, etc. vary across power devices on a given wafer and, potentially more significantly, for the power devices on different wafers. Due to these variations, it may be desirable to adjust the gate drive current level for one or more power devices in an application, at least if power efficiency is to be optimized.

Power devices are used in a variety of circuit applications. Common applications of power devices that require gate drivers include half-bridge and full-bridge circuits. (A full-bridge circuit is merely two half bridges configured in parallel, and will not be further discussed.) A half-bridge circuit includes a high-side and a low-side switch (power device) connected in series between a voltage source and a reference node, e.g., ground, and are connected to each other at a switching node. Half-bridge circuits are commonly used in a variety of switched mode power supplies, including buck converters, boost converters, isolated flyback converters, and resonant converters. The high and low-side switches are alternately switched, such that the high-side switch connects the voltage source to the switching node during a first conducting interval, and the low-side switch connects the switching node to the reference node during a second conducting interval. So as to avoid connecting the voltage source directly to the reference node, the switches should not conduct at the same time. This means that the first and second conducting intervals must be separated by a so-called "dead time," during which neither switch conducts. The dead-time intervals should be minimized so that a high percentage of each switching cycle may be used for transferring power. Reducing the dead-time intervals may be achieved by appropriate setting of the gate driver current level such that the gate control voltage approximates a square wave as closely as feasible for the associated power device.

Gate driver circuitry and techniques that can set optimal or near-optimal current levels for driving the gates of power devices are desired.

SUMMARY

According to an embodiment of a current-mode gate driver circuit, the gate driver circuit comprises an analog current-setting terminal, an adjustable current generator, an output terminal for coupling to a gate terminal of a power device, an output stage, and an input control terminal. The analog current-setting terminal inputs a voltage or current level which is used by the adjustable current generator to generate a reference current level. The input voltage or current is an analog signal that may take any value within a continuous input range. The reference current level similarly takes on any value within a continuous reference current range. The output stage is configured to source current to and/or sink current from the output terminal, wherein the sourced and/or sunk current level is based upon the reference current level. A signal provided at the input control terminal switches the output stage by setting the output stage to source or sink current to the output terminal.

According to an embodiment of a current-mode gate driver system, the system comprises a current-mode gate driver circuit as described above, a controller, and a power device. The controller is configured to provide a gate current control parameter to the analog current-setting terminal of the current-mode gate driver circuit. This gate control parameter may be a control voltage, a control current, a control resistance, or some combination thereof, and has a value within a continuous range. The power device includes a gate terminal that is driven by the output terminal of the current-mode gate driver circuit. The gate terminal controls conduction between first and second terminals of the power device.

According to an embodiment of a method, the method is performed within a current-mode gate driver circuit that comprises an analog current-setting terminal, an adjustable current generator, an output terminal for coupling to a gate terminal of a power device, an output stage, and an input control terminal for switching the output stage. The method begins with steps of inputting a voltage or current level at the analog current-setting terminal, and setting a reference current level that follows the input voltage or current level. A current drive level for the output stage is then set based upon the reference current level, and a current having the current drive level is driven from the output stage to the output terminal. The output stage is switched based upon a control signal provided at the input control terminal, wherein the provided control signal determines whether the output stage should source current to the output terminal or sink current from the output terminal.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments may be combined unless they exclude each other. Embodiments are depicted in the drawings and are detailed in the description that follows.

DETAILED DESCRIPTION

Figure 1:
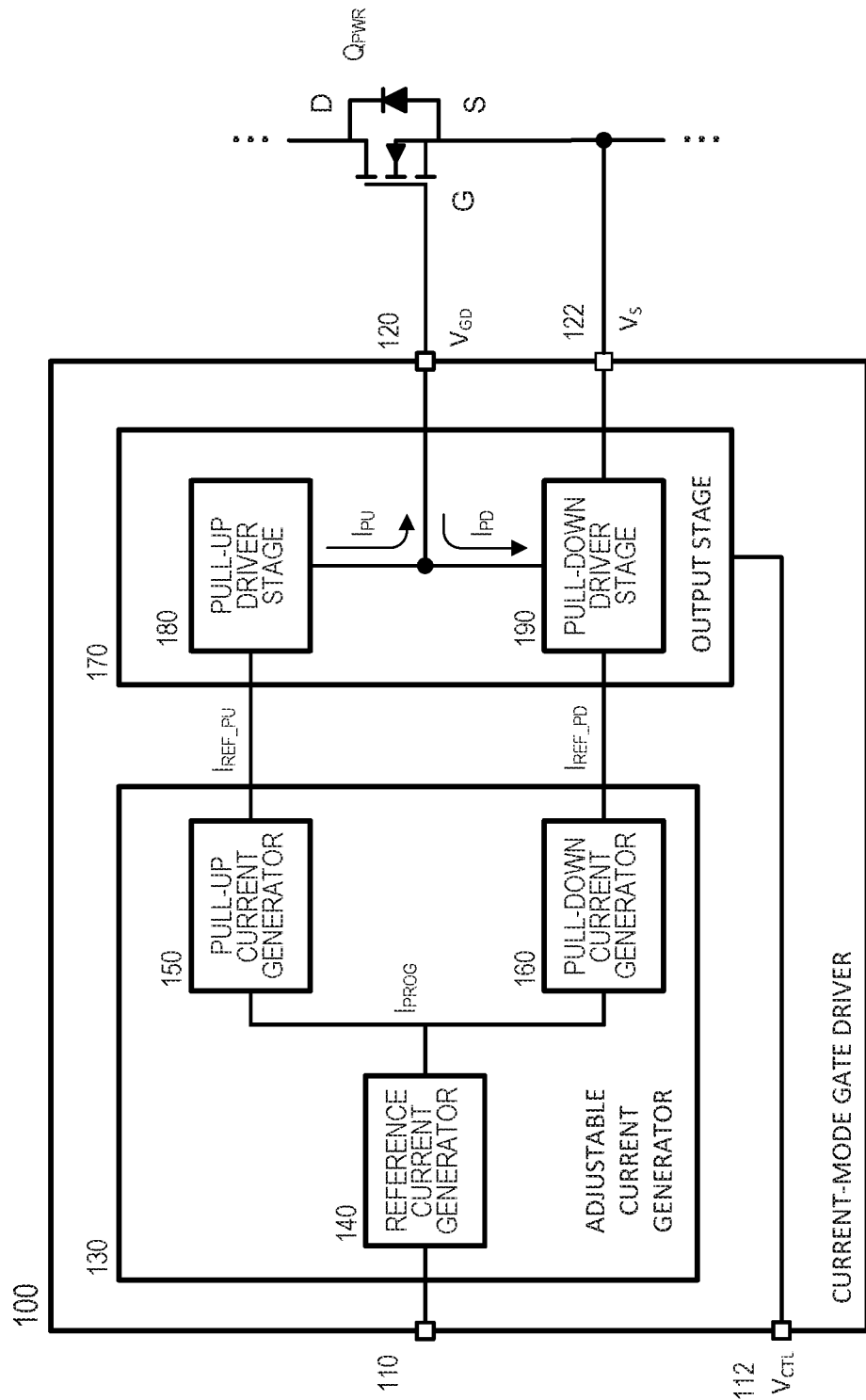
FIG. 1 illustrates a schematic diagram of a current-mode gate driver.

The embodiments described herein provide gate driver circuits and associated methods for driving current for gates (control terminals) of power devices. Power devices, such as power metal-oxide semiconductor field-effect transistors (MOSFETs), insulated-gate bipolar transistors (IGBTs), gallium nitride (GaN) transistors, and silicon carbide (SiC) MOSFETs, are used for switching relatively large currents as is necessary, e.g., to power motors and to provide switching in switched-mode power supplies (SMPSs). SMPSs and other applications commonly arrange power devices in half and full-bridge configurations. Regardless of the application, efficient use of a power device requires that its gate (control terminal) be driven with an appropriate current, i.e., a current that is large enough to limit switching losses but small enough that power used by the gate driver does not negate the benefit of the large gate current and the associated fast switch transitions.

The optimal gate drive current will vary from one power device to the next due, in part, to process variation and/or the expected operating characteristics of the power device. For example, the gate drive current needs to be adapted to the size of the power device that will be driven, so as to match the gate capacitance, and associated gate charge, for a particular power device. The embodiments herein provide gate driver circuits wherein the driven current may be determined from within a continuous range of possible currents, so that such an optimal gate drive current may be set. Several current-mode gate driver circuit embodiments are described below. All of these embodiments include an analog current-setting terminal that is used for programming a current level to be driven by a current-mode gate driver. Depending upon the specific embodiment, a current, voltage, or resistance applied to such an analog current-setting terminal may determine the gate drive current during operation of the current-mode gate driver circuit.

In addition to a use case wherein the parameter (current, voltage, or resistance) applied to the analog current-setting terminal determines the gate drive current at the startup of an electrical system (e.g., SMPS circuit), the gate drive current may also be adapted during normal operation of the electrical system. Changes in the operation (e.g., current through the power device being switched) or environment (e.g., temperature) may make such adaptation advantageous to maintain optimal, or near optimal, efficiency. For such use cases, the parameter applied to the analog current-setting terminal may be varied during normal operation of the system making use of the power device. For example, a controller may set a voltage, current, or resistance provided to the analog current-setting terminal and adapt this parameter in response to changes in temperature, current through the power device, etc.

The embodiments are described below by way of several particular examples of current-mode gate drivers, a system employing a current-mode gate driver, and a method within a current-mode gate driver. These examples have the common feature that the current-mode gate driver within each of them includes an analog current-setting terminal, which is configured to set current levels used for charging and/or discharging a gate of a power device. A parameter (e.g., voltage, current, resistance) provided at the analog current-setting input terminal provides an electrical value within a continuous range, and the gate current level(s) follow a voltage or current level at this terminal. Hence, the gate current level(s) may also be set within a continuous range of currents and, notably, are not limited to a discrete set of current levels as may be associated with a digital interface to a gate driver circuit.

It should be understood that the below examples are not meant to be limiting. Circuits and techniques that are well-known in the art are not described in detail, so as to avoid obscuring unique aspects of the invention. Features and aspects from the example embodiments may be combined or re-arranged, except where the context does not allow this.

The description continues below with an embodiment of a current-mode gate driver circuit that includes an adjustable current generator and an output stage. The adjustable current generator provides one or more reference current levels to the output stage, and current mirrors within the output stage use the reference current level(s) to set one or more output current levels. The output current associated with these levels may be provided to a gate terminal of an external power device, so as to source current to (pull-up) or sink current from (pull-down) a gate of the power device. Described next are several sub-embodiments of the adjustable current generator, wherein the sub-embodiments provide different circuits and techniques for setting the reference current level of the adjustable current generator. A current-mode gate driver system in which a controller provides an analog signal to a current-mode gate driver circuit so as to set the drive current of the gate driver is then described. A further described embodiment of a current-mode gate driver does not rely upon current mirrors within the output stage for setting the output current level, but instead uses a controlled voltage across the gate of a power switch within the output stage to set the output current level. This is followed by a description of an embodiment in which a continuously-valued parameter (e.g., voltage, current) at the analog current setting input terminal, or a variant thereof, is digitized within the current-mode gate driver circuit and used to determine a number of output stage sub-circuits to enable. Lastly, an embodiment of a method within a current-mode gate driver circuit is described.

Current-Mode Gate Driver Circuit

FIG. 1 illustrates an embodiment of a current-mode gate driver circuit 100 comprising an adjustable current generator 130, an output stage 170, an analog current-setting terminal 110, an output terminal 120, and an input control terminal 112. The current-mode gate driver circuit 100 is configured to drive, from the output terminal 120, a gate terminal (G) of a power device $Q_{PWR}$. As illustrated, the power device $Q_{PWR}$ is a power MOSFET external to the current-mode gate driver circuit 100, but the current-mode gate driver circuit 100 could drive other types of power devices and, in some implementations, the power device $Q_{PWR}$ and current-mode gate driver 100 could be integrated.

The adjustable current generator 130 includes a reference current generator 140, which generates a reference current $I_{PROG}$ that follows a voltage or current level input at the analog current-setting terminal 110. This reference current $I_{PROG}$ is provided to a pull-up current generator 150 and a pull-down current generator 160 which output, respectively, a pull-up reference current $I_{REF\_PU}$ and a pull-down reference current $I_{REF\_PD}$. The pull-up and pull-down reference currents $I_{REF\_PU}$, $I_{REF\_PD}$ are based upon the reference current $I_{PROG}$. For example, and as explained in the following sub-embodiments, the current levels of the pull-up and pull-down references $I_{REF\_PU}$, $I_{REF\_PD}$ may be determined by multiplying the reference current $I_{PROG}$ by pull-up and pull-down factors.

The output stage 170 includes a pull-up driver stage 180 and a pull-down driver stage 190, each of which is connected to the output terminal 120. The pull-up driver stage 180 provides a source current $I_{PU}$ based upon the pull-up reference current $I_{REF\_PU}$ which, in turn is based upon the reference current $I_{PROG}$. The pull-down driver stage 190 provides a sink current $I_{PD}$ based upon the pull-down reference current $I_{REF\_PD}$ which, in turn, is based upon the reference current $I_{PROG}$.

A control signal $V_{CTL}$, provided at the input control terminal 112, switches the output stage 170 by determining which of the pull-up and pull-down driver stages 180, 190 is activated. For an example in which the current-mode gate driver is used within an SMPS, the control signal $V_{CTL}$ may be a pulse-width modulated (PWM) signal used for controlling the power output of the SMPS. A high voltage level, e.g., 5V, at the control input terminal 112 enables the pull-up driver stage 180, such that source current $I_{PU}$ is provided, via the output terminal 120, to the gate (G). The source current $I_{PU}$ charges a gate capacitance of the power device $Q_{PWR}$ and raises a gate voltage $V_{GD}$, thereby turning on the power device $Q_{PWR}$. Conversely, a low voltage level, e.g., 0V, at the control terminal 112 enables the pull-down driver stage 190, such that sink current $I_{PD}$ is sunk, via the output terminal 120, from the gate (G). The sink current $I_{PD}$ discharges the gate capacitance of the power device $Q_{PWR}$, thereby lowering the gate voltage $V_{GD}$ and turning off the power device $Q_{PWR}$. As illustrated, the pull-down current $I_{PD}$ is sunk from the gate-drive output terminal 120 to the output source terminal 122, which is coupled to a source terminal (S) of the MOSFET $Q_{PWR}$ and has a voltage Vs. Only one of the pull-up and pull-down driver stages 180, 190 is enabled at once, and the output stage 170 may include circuitry to insert a dead time interval at each transition of the control signal $V_{CTL}$ so as to ensure that the pull-up and pull-down driver stages 180, 190 are not enabled simultaneously.

As explained above, the current-mode gate driver 100 sources the current $I_{PU}$ to the output terminal 120, or sinks the current $I_{PD}$ from the output terminal 120, so as to turn the power device $Q_{PWR}$ on or off. The source and sink currents $I_{PU}$, $I_{PD}$ need not be the same. While both the source and sink currents $I_{PU}$, $I_{PD}$ in FIG. 1 are based upon a voltage or current at the analog current-setting terminal 110, other implementations could include separate analog current-setting terminals for setting the source and sink current levels $I_{PU}$, $I_{PD}$.

Current-Mode Gate Driver Using Current Mirrors in the Output Stage

Figure 2:
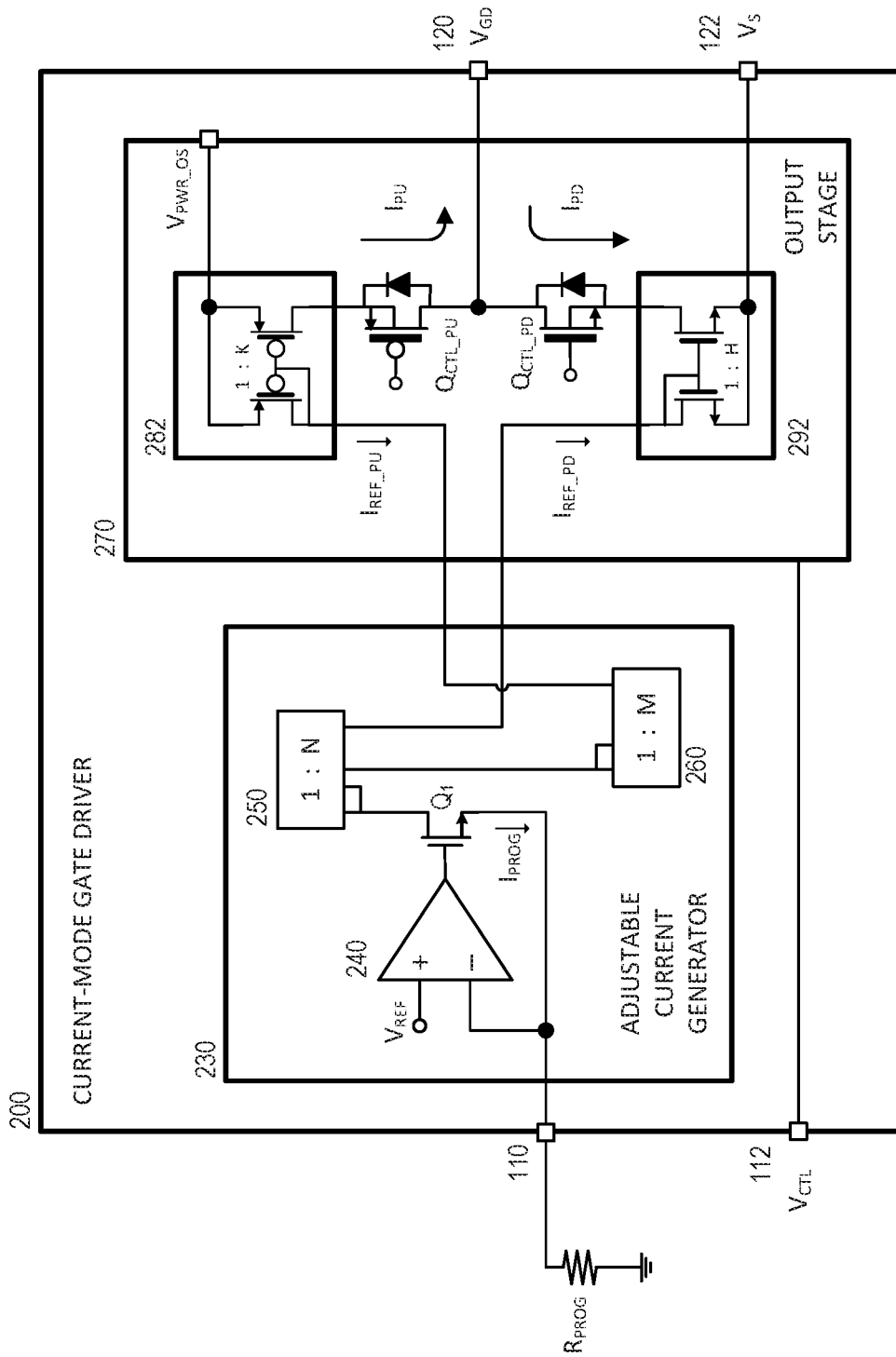
FIG. 2 illustrates a schematic diagram of current-mode gate driver circuitry that uses current mirrors within the output stage and that uses an external resistor to set a reference current level.

FIG. 2 illustrates a current-mode gate driver 200 similar to the gate driver 100 of FIG. 1, but including additional circuit detail. The reference current $I_{PROG}$ is determined from an external programming resistor $R_{PROG}$ coupled between the analog current-setting terminal 110 and ground. An adjustable current generator 230 uses an internal voltage regulator to provide a set voltage at the analog current-setting terminal 110 which, in conjunction with a resistance of the programming resistor $R_{PROG}$, determines the reference current $I_{PROG}$. The analog current-setting terminal 110 is coupled to an inverting input of a differential amplifier 240, such that the set voltage follows an internally-generated reference voltage $V_{REF}$ that is coupled to a non-inverting input of the differential amplifier 240. The reference current $I_{PROG}$, which takes a value of $I_{PROG}=V_{REF}/R_{PROG}$, flows through the MOSFET $Q_1$ and the external resistor $R_{PROG}$. The reference current $I_{PROG}$ is relatively small, at least in comparison to the source and sink currents $I_{PU}$, $I_{PD}$ provided at the output terminal 120, so as to limit the power loss incurred in the MOSFET $Q_1$ and the programming resistor $R_{PROG}$.

The reference current $I_{PROG}$ also flows through a first current mirror 250, which provides a current transfer multiplication of N and mirrors the reference current $I_{PROG}$ to provide a pull-down reference current $I_{REF\_PD}=N*I_{PROG}$. (It should be understood that a power source supplies the currents for the first current mirror 250. For ease of illustration, such a power source is not shown.) The current mirror 250 may comprise a first MOSFET through which $I_{PROG}$ flows, and N additional MOSFETs arranged in parallel, wherein a current $I_{PROG}$ flows through each of the N parallel MOSFETs yielding the output current $I_{REF\_PD}=N*I_{PROG}$, as shown. Alternatively, the current mirror 250 may include only a first MOSFET and a second MOSFET, wherein the size (channel length and width) of the second MOSFET is larger than that of the first MOSFET, such that the second MOSFET provides a current $N*I_{PROG}$. In other alternatives, bipolar junction transistors (BJTs) or other transistor types may be used instead of MOSFETS. Because current mirrors are generally well-known, further details are not provided herein.

A second current mirror 260 has a replica of the reference current $I_{PROG}$ flowing through it. As illustrated in FIG. 2, such a replica may be provided by another mirror branch (e.g., MOSFET) of the first current mirror 250. The second current mirror 260 provides a current transfer multiplication of M, such that a mirrored pull-up reference current $I_{REF\_PU}=M*I_{PROG}$ flows through the second current mirror 260. The factors M and N need not be the same, and need not be integers.

The pull-up and pull-down reference currents $I_{REF\_PU}$, $I_{REF\_PD}$ are provided to the output stage 270. The output stage 270 includes a pull-up current mirror 282, a pull-up control switch $Q_{CTL\_PU}$, a pull-down current mirror 292, and a pull-down control switch $Q_{CTL\_PD}$.

The pull-up current mirror 282 is supplied from an output-stage power source $V_{PWR\_OS}$, has the pull-up reference current $I_{REF\_PU}$ flowing through it, and provides a 1:K current transfer multiplication, such that a pull-up current $I_{PU}=K*I_{REF\_PU}$ flows from another branch of the pull-up current mirror 282. A pull-up control switch $Q_{CTL\_PU}$ switchably couples the pull-up current $I_{PU}$ of the current mirror 282 to the output terminal 120, based upon the control signal $V_{CTL}$. When the pull-up control switch $Q_{CTL\_PU}$ is turned on, the pull-up current $I_{PU}$ flowing to the output terminal 120 may be used to charge the gate terminal of an external power device, such as the power device $Q_{PWR}$ illustrated in FIG. 1. As illustrated in FIG. 2, the pull-up control switch $Q_{CTL\_PU}$ is a p-channel MOSFET, meaning a low voltage level must be applied to its gate to turn the control switch $Q_{CTL\_PU}$ on. Other switch types, e.g., n-channel MOSFET, BJT, IGBT, may alternatively be used as a pull-up control switch that controls whether or not current is sourced to the output terminal 120.

The pull-down reference current $I_{REF\_PD}$ flows through the pull-down current mirror 292, which provides a 1:H current transfer ratio such that a pull-down current $I_{PD}=H*I_{REF\_PD}$ flows through another branch of the pull-down current mirror 292 when the pull-down control switch $Q_{CTL\_PD}$ is turned on. When the pull-down control switch $Q_{CTL\_PD}$ is turned on, the pull-down current $I_{PD}$ flows from the output terminal 120 so as to discharge the gate terminal of an external power device, such as the MOSFET $Q_{PWR}$ illustrated in FIG. 1. As illustrated in FIG. 2, the pull-down control switch $Q_{CTL\_PD}$ is an nMOSFET, but it should be understood that other switch types, e.g., BJT, IGBT, may alternatively be used to control whether or not current is sunk from the output terminal 120.

Alternative Techniques for Setting the Reference Current

The current-mode gate driver 200 of FIG. 2 uses an external resistor $R_{PROG}$ to set a reference current $I_{PROG}$ which, ultimately, sets levels for the pull-up and pull-down currents $I_{PU}$, $I_{PD}$ that are used for sourcing current to and sinking current from the gate terminal of an external power device, e.g., the MOSFET $Q_{PWR}$ of FIG. 1. While the resulting reference current $I_{PROG}$ may be precisely set and have minimal variation with temperature, alternative techniques for setting the reference current $I_{PROG}$ may be preferable in some applications. Described below are such alternative techniques for setting the reference current $I_{PROG}$. The circuits described below are similar to the circuit for the current-mode gate driver 200 described above, and only those aspects that differ are explained in detail.

Figure 3:
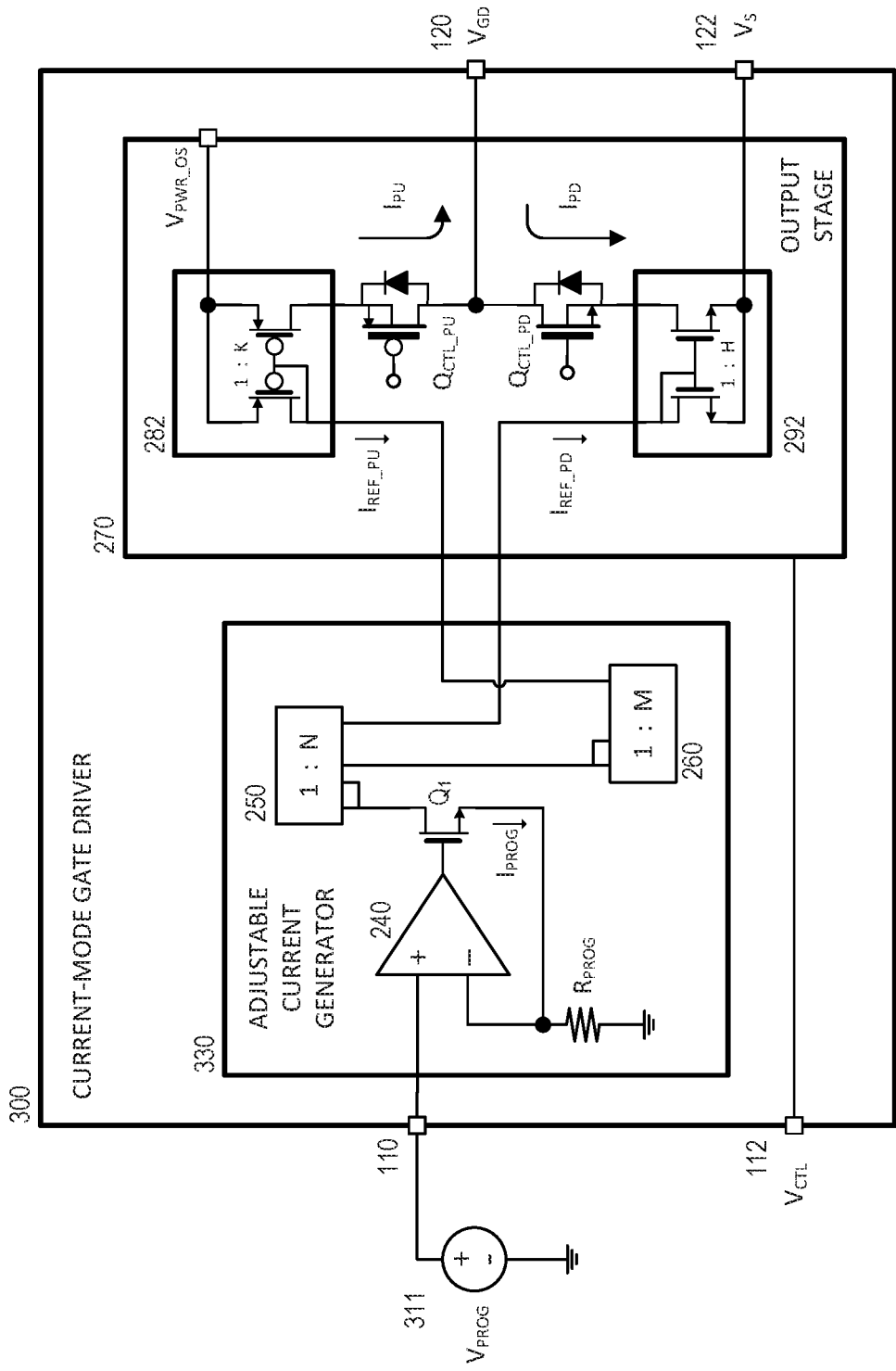
FIG. 3 illustrates a schematic diagram of current-mode gate driver circuitry that uses an external voltage reference to set a reference current level.

FIG. 3 illustrates a current-mode gate driver 300 that includes an adjustable current generator 330 having a circuit topology similar to that of the adjustable current generator 230 of FIG. 2. However, the programming resistor $R_{PROG}$ is internal to the adjustable current generator 330, and the reference voltage provided to the differential amplifier 240 is supplied from an external programming voltage source 311 that is coupled to the analog current-setting terminal 110. The reference current $I_{PROG}$ and the pull-up and pull-down currents $I_{PU}$, $I_{PD}$ determined therefrom are set by the voltage level $V_{PROG}$ of the voltage source 311. As compared with the topology of current-mode gate driver 200, this technique has the disadvantage that the reference current $I_{PROG}$ may have greater dependency on temperature as the resistance of the internal programming resistor $R_{PROG}$ is affected by temperature variation within the gate driver 300, but has the advantage that no reference voltage source $V_{REF}$ is required within the current-mode gate driver 300. Such a circuit 300 may be preferable in applications wherein a programming voltage source 311 is readily available. For example, a controller external to the current-mode gate driver 300 may provide the analog voltage $V_{PROG}$ using a digital-to-analog converter (DAC). Such a DAC-provided programming voltage $V_{PROG}$ could be initially determined during a calibration phase, and could further be adjusted as needed during operational mode so as to maintain optimal pull-up and pull-down currents $I_{PU}$, $I_{PD}$.

Figure 4:
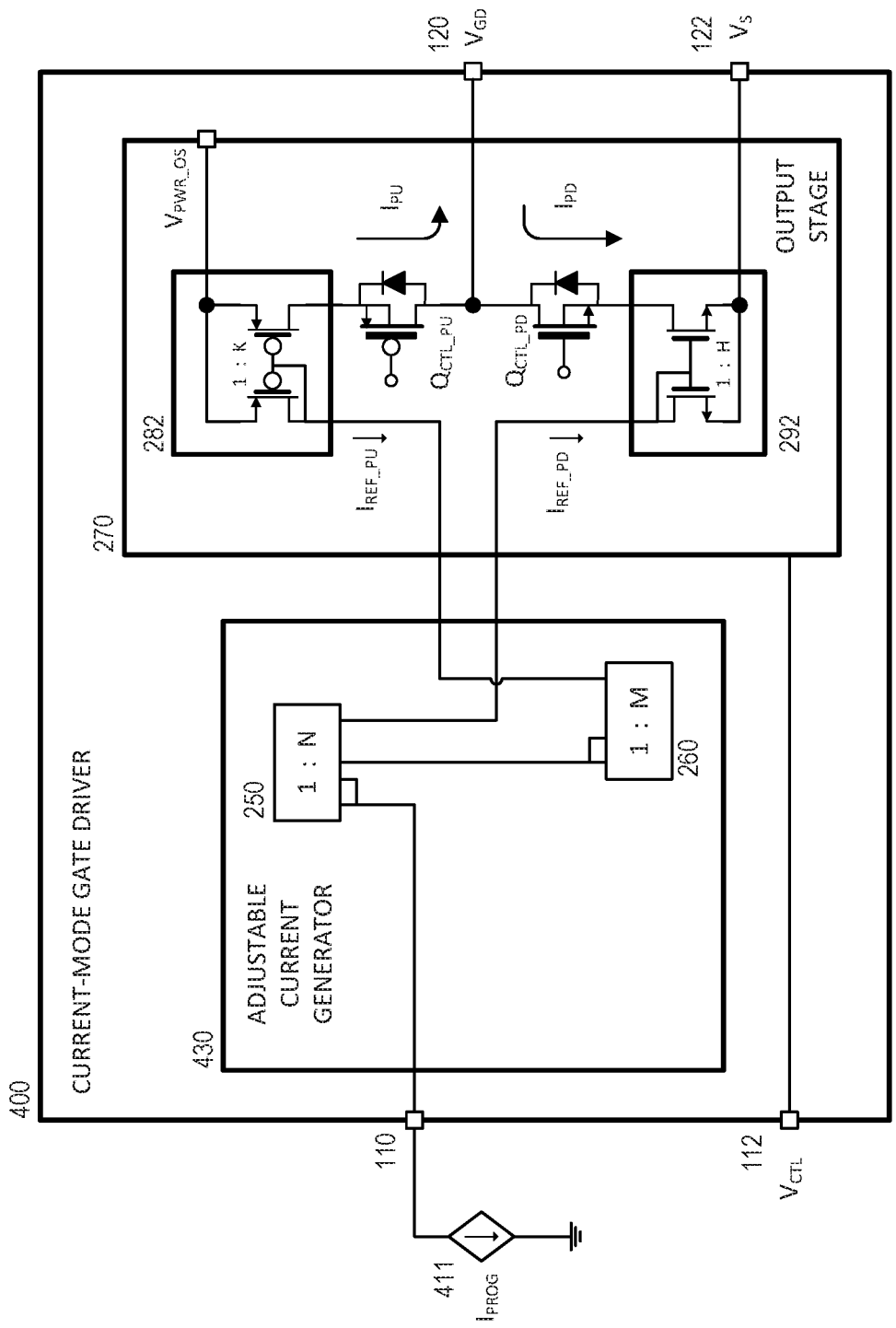
FIG. 4 illustrates a schematic diagram of current-mode gate driver circuitry that uses an external current source to set a reference current level.

FIG. 4 illustrates a current-mode gate driver 400 including an adjustable current generator 430 that requires no internal voltage regulator. Instead, the reference current $I_{PROG}$ is set by a current source 411 external to the current-mode gate driver 400. By removing the circuitry, e.g., differential amplifier 240 and MOSFET $Q_1$, associated with an internal voltage regulator, the current-mode gate driver 400 is simpler (smaller and cheaper) than the gate drivers described previously. Control of the reference current level $I_{PROG}$ from an external current source 411 may be preferred in applications wherein such a current source 411 is readily available, and may have a further advantage when the current source 411 is adjustable such that the pull-up and pull-down current levels $I_{PU}$, $I_{PD}$ may be set to appropriate levels during a calibration phase and may be further adjusted during operational modes such that the external power switch $Q_{PWR}$ is switched in an optimal manner, e.g., by setting the current level $I_{PROG}$ of the current source 411 from a controller.

Figure 5:
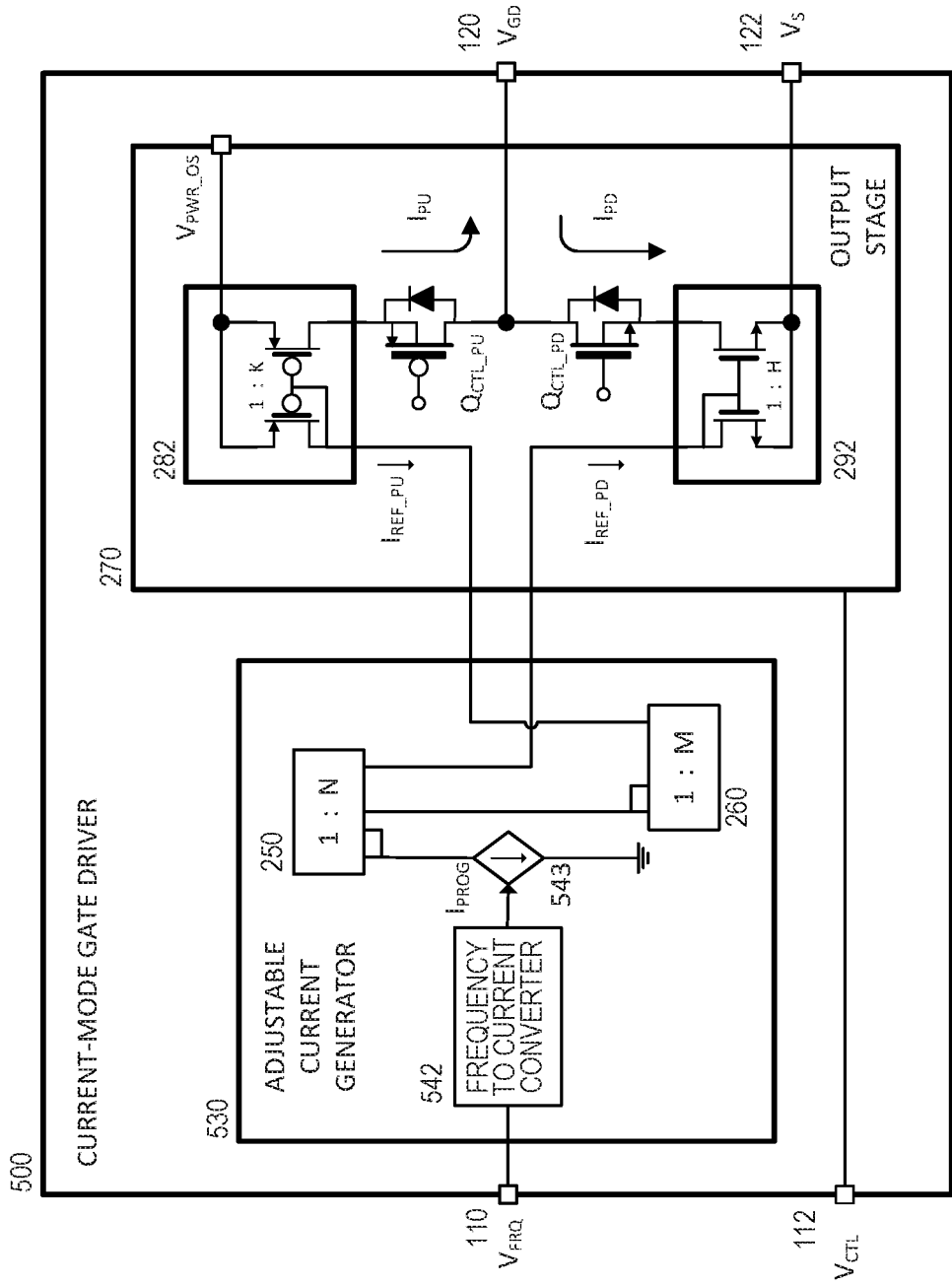
FIG. 5 illustrates a schematic diagram of current-mode gate driver circuitry that uses an externally-provided frequency to set a reference current level.

FIG. 5 illustrates a current-mode gate driver 500 using yet another technique for setting the reference current $I_{PROG}$. The analog current-setting terminal 110 is configured to input a waveform $V_{FRQ}$, such as a PWM waveform, having a discernible frequency. A frequency-to-current converter 542 within the adjustable current generator 530 determines a frequency of the waveform $V_{FRQ}$ and converts this frequency into a current level setting of an internal current source 543 that provides the reference current $I_{PROG}$. This current-mode gate driver 500 may be preferable in applications in which a PWM waveform, such as the illustrated $V_{FRQ}$, is readily available.

Figure 6:
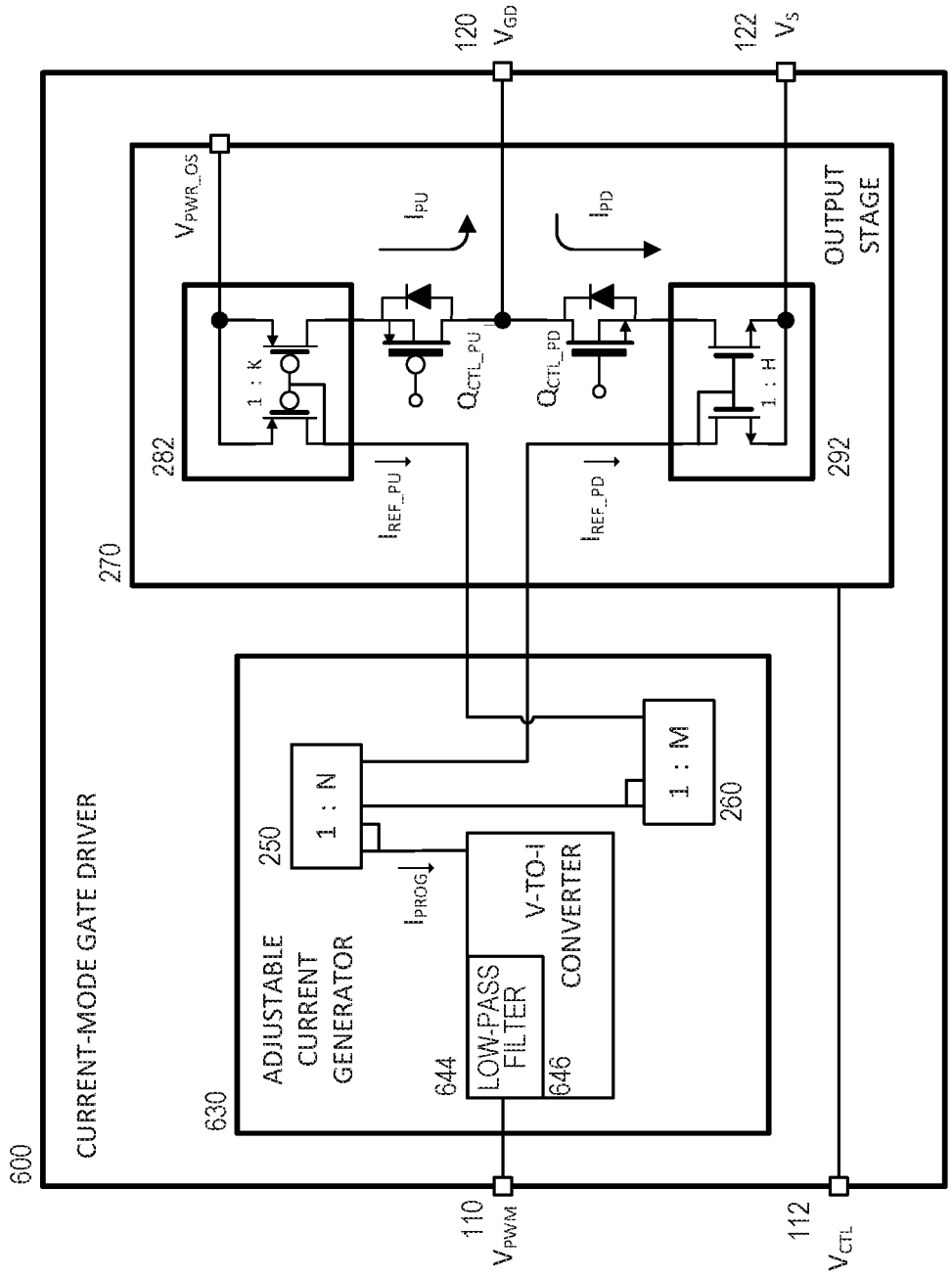
FIG. 6 illustrates a schematic diagram of current-mode gate driver circuitry that uses a duty cycle of a pulse-width modulated (PWM) signal to set a reference current level.

FIG. 6 illustrates a current-mode gate driver 600 that uses yet a further technique for setting the reference current $I_{PROG}$. The analog current-setting terminal 110 is configured to input a PWM waveform $V_{PWM}$ that is used for setting the reference current level $I_{PROG}$. A low-pass filter 646 within the adjustable current generator 630 filters the PWM waveform $V_{PWM}$ to provide a filtered voltage level. A voltage-to-current (V-to-I) converter 644 uses the filtered voltage level to set a current level for the reference current $I_{PROG}$, as provided by a current source within the V-to-I converter 644. (For ease of illustration, such a current source is not explicitly shown.) The current-mode gate driver 600 may be preferable in applications wherein a PWM waveform $V_{PWM}$ having an adjustable duty cycle is readily available.

The current-mode gate driver 200 of FIG. 2 uses a programming resistor $R_{PROG}$ to set the reference current $I_{PROG}$. Relative to the embodiments of FIGS. 3-6, the circuitry 200 has a disadvantage that the reference current $I_{PROG}$ cannot be readily adjusted, e.g., by a controller. The embodiments described below with reference to FIGS. 7 and 8 provide techniques in which the reference current $I_{PROG}$ can be set and adjusted using a controller, in conjunction with an external resistance.

Figure 7:
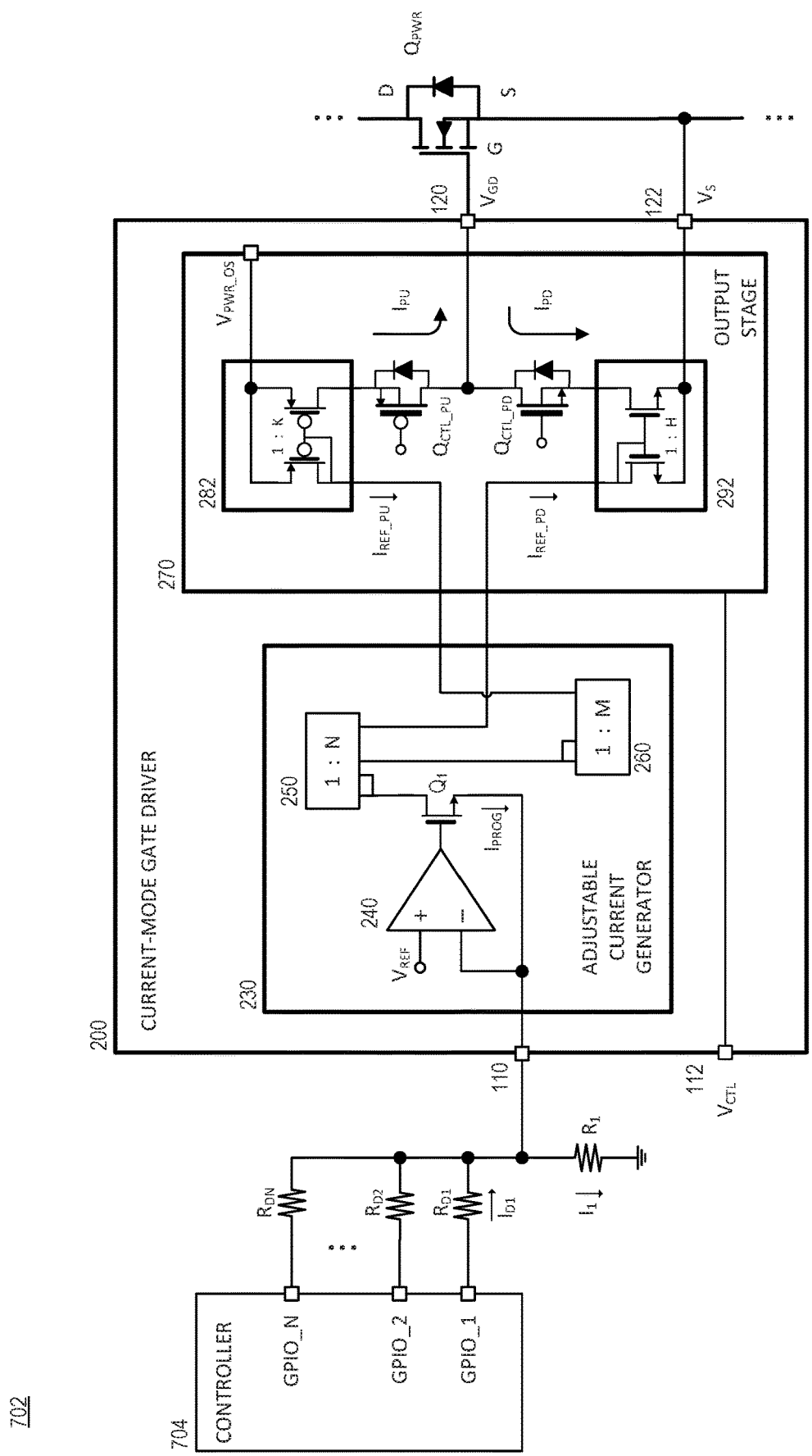
FIG. 7 illustrates a current-mode gate driver system in which a controller sets a reference current by using general purpose input/output (GPIO) pins.
Figure 8:
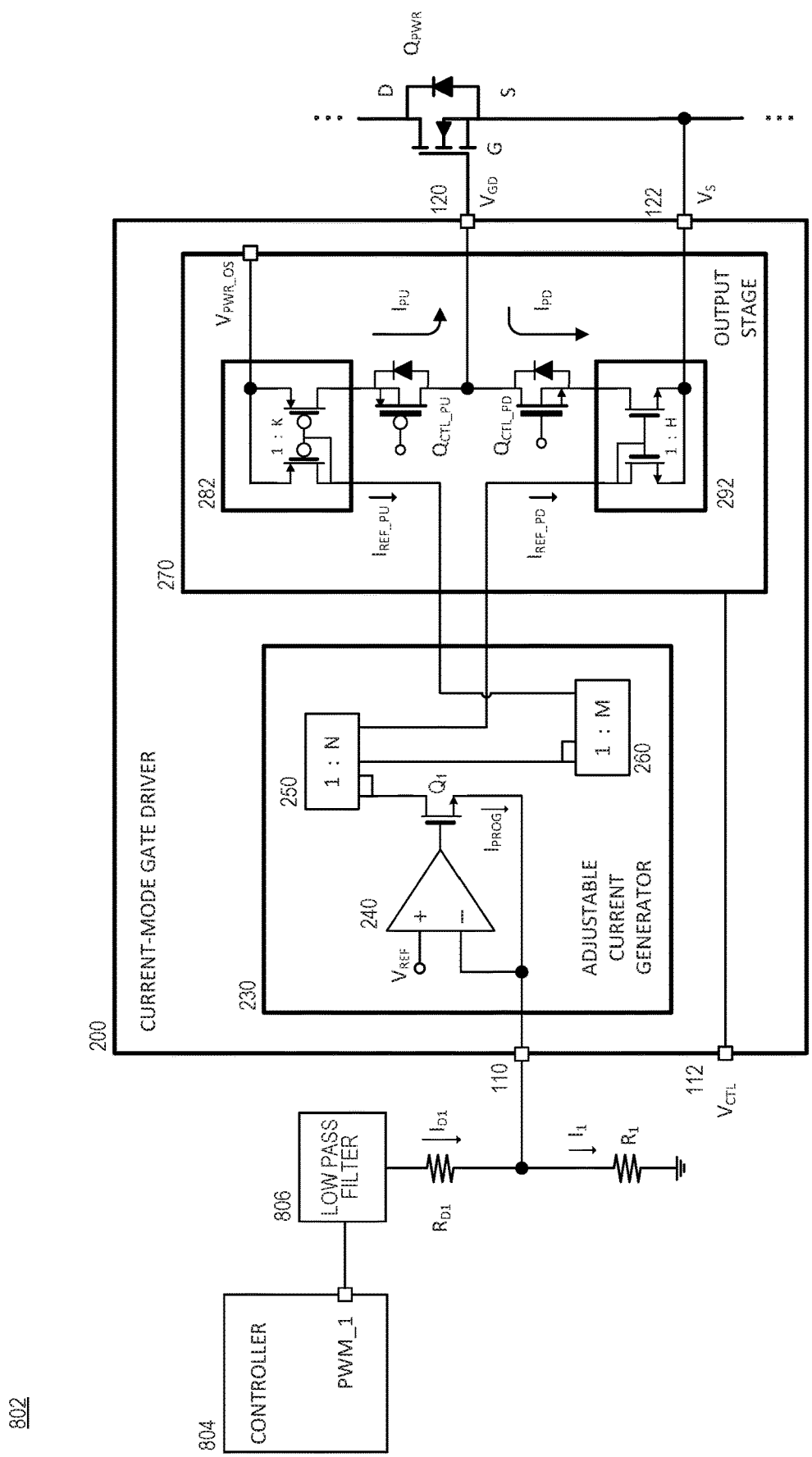
FIG. 8 illustrates a current-mode gate driver system in which a controller sets a reference current using pulse-width-modulated (PWM) signals.

FIG. 7 illustrates a current-mode gate driver system 702 including a controller 704, a current-mode gate driver 200, and a power device $Q_{PWR}$. Whereas the reference current $I_{PROG}$ of the current-mode gate driver 200 was previously described as being determined by a programming resistor $R_{PROG}$ coupled between the analog current-setting terminal 110 and ground, the system 702 of FIG. 7 includes a controller 704 which may adjust the reference current $I_{PROG}$. Such adjustments may be made during an initial calibration stage and during operation of the system 702, via appropriate usage of general-purpose input/output (GPIO) terminals of the controller 704 and the resistors $R_{D1}, R_{D2}, \ldots R_{DN}$.

In a first sub-embodiment, the GPIO terminals may be used to connect some or all of the resistors $R_{D1}, R_{D2}, \ldots R_{DN}$ to ground. The resistance offered by the connected resistors and $R_1$ provides an effective programming resistance $R_{PROG}$ for setting the reference current $I_{PROG}$, as described above in relation to FIG. 2. For example, the controller may connect the resistor $R_{D2}$ to ground by setting GPIO_2 low, and leave the remaining GPIO pins tri-stated. A programming resistance given by $$R_{PROG} = (R_1 \| R_{D2}) = \frac{1}{\frac{1}{R_1} + \frac{1}{R_{D2}}}$$

determines the reference current according to $$I_{PROG} = \frac{V_{REF}}{(R1\|RD2)}.$$

The controller 704 may ground additional GPIO pins to introduce additional resistors into $R_{PROG}$, thereby reducing the resistance $R_{PROG}$ and increasing the reference current $I_{PROG}$, as needed.

In a variation of the first sub-embodiment described above, the controller 704 may also adjust the reference current $I_{PROG}$ by driving GPIO pins to a high level. For example, GPIO_1 could be set to a high level $V_{dd}$, corresponding to the power source of the controller 704. A current flowing through the resistor $R_{D1}$ takes a value of $$I_{D1} = \frac{V_{dd} - V_{REF}}{(RD1)}.$$

A current $I_1$ flowing through $R_1$ is given by $$I_1 = \frac{V_{REF}}{(R1)},$$

which leaves the reference current $$I_{PROG} = I_1 - I_{D1} = \frac{V_{REF}}{(R1)} - \frac{V_{dd} - V_{REF}}{(RD1)}.$$

Assuming $V_{dd}$ is greater than $V_{REF}$, resistors $R_{Dx}$ may be connected to $V_{dd}$ in this way so as to reduce the reference current $I_{PROG}$. The controller 704 may set additional GPIO pins high to increase the current flowing through the resistors $R_{Dx}$, thereby decreasing the reference current $I_{PROG}$.

The GPIO pins of the controller 704 may be set to a mixture of low levels, high levels, and tri-state (open) levels. The resistors $R_{D1}, R_{D2}, \ldots R_{DN}$ may be chosen to have different resistances. By using different resistances and a mixture of GPIO states, the controller 704 may use the analog current-setting terminal 110 to adjust the reference current $I_{PROG}$ to many levels beyond that provided by a single external resistor $R_{PROG}$, as provided in FIG. 2. While the resistor $R_1$ is illustrated as external to the current-mode gate driver 200, it may also be located within the gate driver 200.

Achieving several adjustment levels using the controller 704 requires the use of numerous GPIO pins. FIG. 8 illustrates an embodiment of another current-mode gate driver system 802. This system 802 includes a controller 804 that drives a PWM signal PWM_1 for setting the reference current $I_{PROG}$. A low pass filter 806 filters the PWM signal PWM_1 output from the controller 804, providing an output voltage that determines the current $I_{D1}$ through the resistor $R_{D1}$. While only a single PWM output is shown in FIG. 8, a controller 804 may provide multiple PWM outputs. Due to the required low-pass filtering to achieve a DC (or near DC) signal, usage of a PWM output for controlling the reference current $I_{PROG}$ is most appropriate for applications in which the reference current $I_{PROG}$ does not need to be dynamically adjusted during operation of the system 802, or in applications in which a relatively slow adaptation is acceptable.

In another alternative, the controller 804 may include a (non-PWM) digital-to-analog converter (DAC) that directly outputs a voltage that determines, in conjunction, e.g., with the resistors $R_1$ and $R_{D1}$, the reference current $I_{PROG}$.

Techniques that Use Power Switch Gate Voltages to Set Current Levels

The current-mode gate drivers described above use current mirrors within an output stage to set pull-up and pull-down current levels used to source current to and sink current from the gate terminal of a power device (switch). Pull-up and pull-down control switches are used in a binary manner to determine whether to source or sink current, but do not determine the current levels used. In an alternative embodiment described below, power switches within an output stage are used to set pull-up and pull-down current levels by precisely controlling voltages applied to the gate (control) terminals of the pull-up and pull-down power switches. This embodiment provides an advantage over the embodiments described previously in that current mirrors are not required within the output stage.

Figure 9:
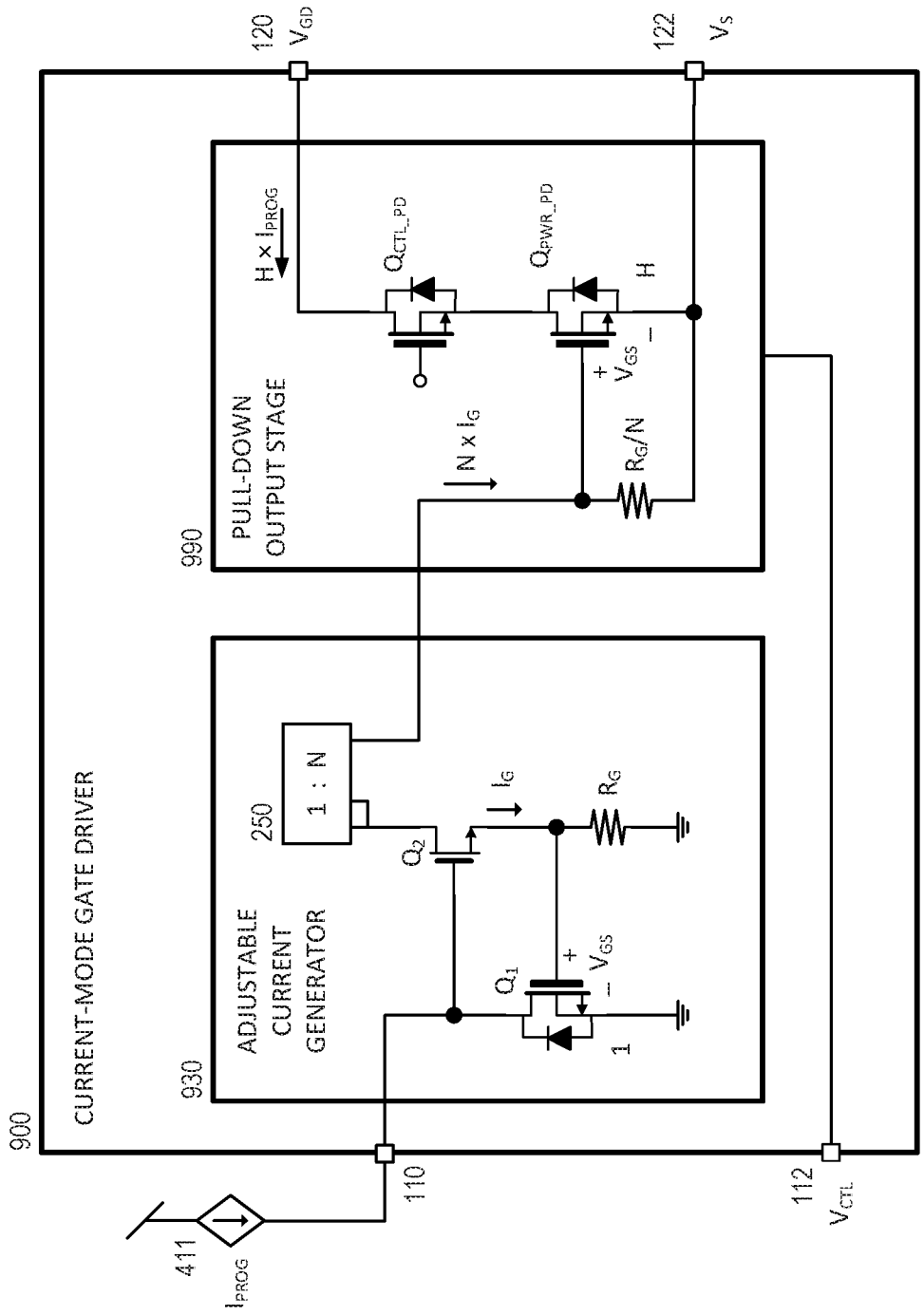
FIG. 9 illustrates a schematic diagram of current-mode gate driver circuitry that uses a gate voltage of a reference power switch to set a pull-down current level of an output stage.

FIG. 9 illustrates a current-mode gate driver 900 that includes an adjustable current generator 930 and a pull-down output stage 990. An external current source 411 is coupled to the analog current-setting terminal 110, but it should be understood that the previously-described circuits and techniques may similarly be used for providing the reference current $I_{PROG}$. While not illustrated, it should also be understood that the current-mode gate driver 900 may also include a pull-up output stage that is coupled to the output terminal 120.

The adjustable current generator 930 includes a first switch $Q_1$, a second switch $Q_2$, a resistor $R_G$ and a current mirror 250. As illustrated, the first and second switches $Q_1$ and $Q_2$ are MOSFETs which operate in their saturation regions. With the first switch $Q_1$ operating in its saturation region, the current $I_{PROG}$ flowing from its drain to its source terminals determines the gate voltage $V_{GS}$ of the switch. The current $I_G$ flowing through the second switch $Q_2$ is determined by the gate voltage $V_{GS}$ and the resistance $R_G$ according to $$I_G = \frac{V_{GS}}{R_G}.$$

The current $I_G$ flows through the current mirror 250, which provides a current transfer multiplication of N, thereby providing a current $N \times I_G$ to the pull-down output stage 990.

The current $N \times I_G$ flows through a resistor having a resistance $$\frac{R_G}{N}$$

within the pull-down output stage 990. This sets the gate-to-source voltage $V_{GS}$ on the pull-down power switch $Q_{PWR\_PD}$ to be the same as the gate-to-source voltage $V_{GS}$ of the first switch $Q_1$. If the pull-down power switch $Q_{PWR\_PD}$ and the first switch $Q_1$ are the same (e.g., fabricated with the same process technology and size), their drain-to-source currents will be the same. In the preferred embodiment that is illustrated, the pull-down power switch $Q_{PWR\_PD}$ is larger than the first switch $Q_1$, such that the drain-to-source current of the pull-down power switch $Q_{PWR\_PD}$ is H times that of the first switch $Q_1$, for a given gate voltage, leading to the current $H \times I_{PROG}$ flowing through the pull-down power switch $Q_{PWR\_PD}$. The multiplication factor of H may be accomplished by implementing the pull-down power switch $Q_{PWR\_PD}$ as H individual MOSFETs in parallel, each of which is the same as the first switch $Q_1$, or by increasing the channel width of the pull-down power switch $Q_{PWR\_PD}$ relative to that of the first switch $Q_1$. The resultant current $H \times I_{PROG}$ may be used to sink current from, and thus discharge, via the output terminal 120, the gate terminal of a power device such as the MOSFET $Q_{PWR}$ illustrated in FIG. 1.

The current mirror 250 allows for relatively small currents $I_{PROG}$ and $I_G$ to be used effectively. Relative to a topology having no such current mirror, ohmic losses are reduced within the first switch $Q_1$, the second switch $Q_2$, and the resistor $R_G$.

As explained previously in relation to FIG. 2, the pull-down control switch $Q_{CTL\_PD}$ determines, based upon the control signal $V_{CTL}$ provided at the control terminal 112, when current is to be sunk from the output terminal 120. In a typical implementation, a low level, e.g., 0V, at the control terminal 112 will turn on the control switch $Q_{CTL\_PD}$, thereby enabling the pull-down current $I_{PD} = H \times I_{PROG}$ to be sunk from the gate-drive output terminal 120.

Figure 10:
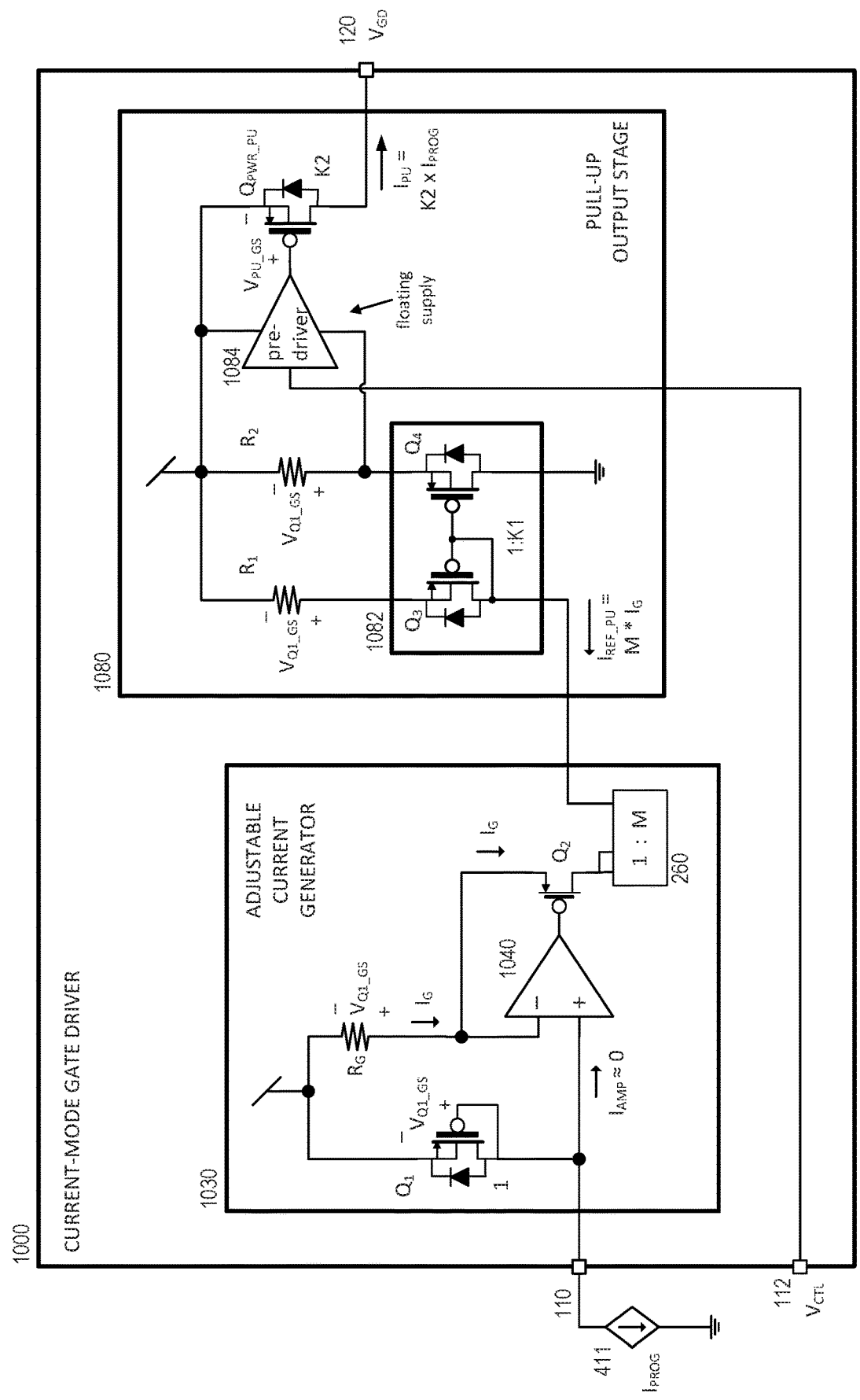
FIG. 10 illustrates a schematic diagram of current-mode gate driver circuitry that uses a gate voltage of a reference power switch to set a pull-up current level of an output stage.

FIG. 10 illustrates an embodiment of a current-mode gate driver 1000 that uses some techniques that are common to those of the current-mode gate driver 900 including, notably, that the gate-to-source (control) voltage of a reference switch is controlled by a reference current $I_{PROG}$, and this gate-to-source voltage is replicated at a power switch to control the current level provided by the gate driver. As described below, the current-mode gate driver 1000 also includes some variations of the previously-described gate driver circuitry. For ease of explanation and illustration, the current-mode gate driver 1000 only shows an output stage having a pull-up capability. It should be understood that a typical power device, e.g., the MOSFET $Q_{PWR}$ of FIG. 1, will have another associated gate driver circuit for providing a pull-down gate drive capability, or that a pull-down output stage, such as or similar to the pull-down output stage 990 illustrated in FIG. 9, may also be included within the current-mode gate driver 1000.

The current-mode gate driver 1000 includes a pull-up output stage 1080 and an adjustable current generator 1030. An external current source 411 is coupled to the analog current-setting terminal 110, but it should be understood that the previously-described circuits and techniques may similarly be used for providing the reference current $I_{PROG}$.

The adjustable current generator 1030 includes a first switch $Q_1$, a second switch $Q_2$, a resistor $R_G$, an operational amplifier 1040 and a current mirror 260 for providing a pull-up reference current $M \times I_G$ to the pull-up output stage 1080. In contrast to the switches of the adjustable current generator 970 illustrated in FIG. 9, the switches $Q_1$, $Q_2$ of FIG. 10 are p-channel MOSFETs (pMOSFETs). The first and second switches $Q_1$ and $Q_2$ operate in their saturation regions when the current source 411 supplies the reference current $I_{PROG}$. With the first switch $Q_1$ operating in its saturation region, the current $I_{PROG}$ flowing from its source to its drain terminals determines the gate voltage $V_G$s of the switch $Q_1$. The operational amplifier 1040 sets the voltage at the bottom of the resistor $R_G$, i.e., at the source of the second switch $Q_2$, to be the same as the drain voltage of the first switch $Q_1$. With the gate and drain of the first switch $Q_1$ tied together, this forces the voltage across $R_G$ to be the same as the gate-to-source voltage $V_{Q1\_GS}$ across the first switch $Q_1$. The operational amplifier 1040 provides isolation between the drain of the first switch $Q_1$ and the source of the second switch $Q_2$, while maintaining a common voltage at these nodes.

The level of current $I_G$ flowing through the second switch $Q_2$ is determined by the gate voltage $V_{Q1\_GS}$ and the resistance $R_G$ according to $$I_G = -\frac{V_{Q1\_GS}}{R_G}.$$

Note that, because the first switch $Q_1$ is a pMOSFET operating in its saturation region, the gate-to-source voltage $V_{Q1\_GS}$ will actually be negative, such that the current $I_G$ is positive in the direction illustrated. The current $I_G$ flows through the current mirror 260, which provides a current transfer multiplication of M, thereby providing a pull-up reference current $I_{PU} = M \times I_G$ to the pull-up output stage 1080.

The pull-up output stage 1080 includes a current mirror 1082, a pre-driver 1084, and a pull-up power switch $Q_{PWR\_PU}$. The pull-up current level $I_{PU}$ is based upon a gate-to-source voltage $V_{PU\_GS}$ of the pull-up power switch $Q_{PWR\_PU}$ which is determined, in part, by the reference current $I_{PROG}$. More particularly, the gate-to-source voltage $V_{PU\_GS}$ is set to the gate-to-source voltage $V_{Q1\_GS}$ of the first switch $Q_1$ within the adjustable current generator 1030, when the control voltage $V_{CTL}$ at the control terminal 112 indicates that the pull-up current should be turned on (active). Note that the pull-up output stage 1080 does not include an explicit control switch such as the pull-down control switch $Q_{CTL\_PD}$ of FIG. 9. Instead, the pre-driver 1084 performs the control switching in conjunction with the pull-up power switch $Q_{PWR\_PU}$.

The pull-up reference current $I_{REF\_PU}=M \times I_G$ flows through the mirror switch $Q_3$ and a resistor $R_1$ having a resistance $$\frac{R_G}{M}.$$

The resultant voltage across the resistor $R_1$ is the same as the gate-to-source voltage $V_{Q1\_GS}$ of the first switch $Q_1$ within the adjustable current generator 1030. The current mirror 1082 includes another switch $Q_4$, which is larger than the switch $Q_3$, such that the current through the switch $Q_4$ is K1 times that of the current $I_{REF\_PU}$ through the switch $Q_3$. A resistor $R_2$ connected to the mirror switch $Q_4$ has a resistance $$\frac{R_G}{M*K1},$$

such that the voltage across the resistor $R_2$ is also the same as the gate-to-source voltage $V_{Q1\_GS}$ of the first switch $Q_1$. With the same voltage $V_{Q1\_GS}$ across each of the resistors $R_1$ and $R_2$, the gate-to-source voltages of the switches $Q_3$, $Q_4$ within the current mirror 1082 are the same, so as to maintain a current ratio of 1:K1 for the currents flowing through these switches $Q_3$, $Q_4$. The switch $Q_4$ is configured to provide a high current level, as compared to the switch $Q_3$, so that the pre-driver 1084 has a large current source for driving the gate of the pull-up power switch $Q_{PWR\_PU}$.

The pre-driver circuit 1084 provides a floating supply for driving the pull-up power switch $Q_{PWR\_PU}$. Based upon the control signal $V_{CTL}$ provided at the control input terminal 112, the pre-driver 1084 sets the voltage at the gate of the pull-up power switch $Q_{PWR\_PU}$ to be the same as the source voltage of the pull-up power switch $Q_{PWR\_PU}$, or to be set to a voltage lower than the source voltage by the magnitude of $V_{Q1\_GS}$. (For the pMOSFET switches $Q_1$, $Q_{PWR\_PU}$ illustrated, the gate-to-source voltages $V_{Q1\_GS}$, $V_{PU\_GS}$ must be negative to turn on these switches.) The pull-up power switch $Q_{PWR\_PU}$ is configured to provide a current K2 times that of the first switch $Q_1$, e.g., via appropriate design of the channel widths within these switches, so that a pull-up current $I_{PU}=K2 \times I_{PROG}$ is provided to the gate-drive output terminal 120.

Use of Multiple Dynamically-Enabled Gate Driver Circuits

The previously-described circuits provide output pull-up and pull-down current levels for sourcing current to or sinking current from the gate terminal of a power device, wherein the current levels may be set to any value within a continuous range of output values. Described below are circuits having multiple pull-up driver stage circuits, which may be individually enabled to achieve different pull-up and pull-down current levels. While the output current levels may come from a discrete set of output current levels, these levels are still determined based upon a voltage or current at an analog current-setting terminal, wherein this input voltage or current takes on a value from within a continuous range. Hence, the circuit of FIG. 11 which is described below maintains the advantage that the drive current may be set based upon a single analog input, i.e., multiple terminals are not required and a digital interface is not required.

Figure 11:
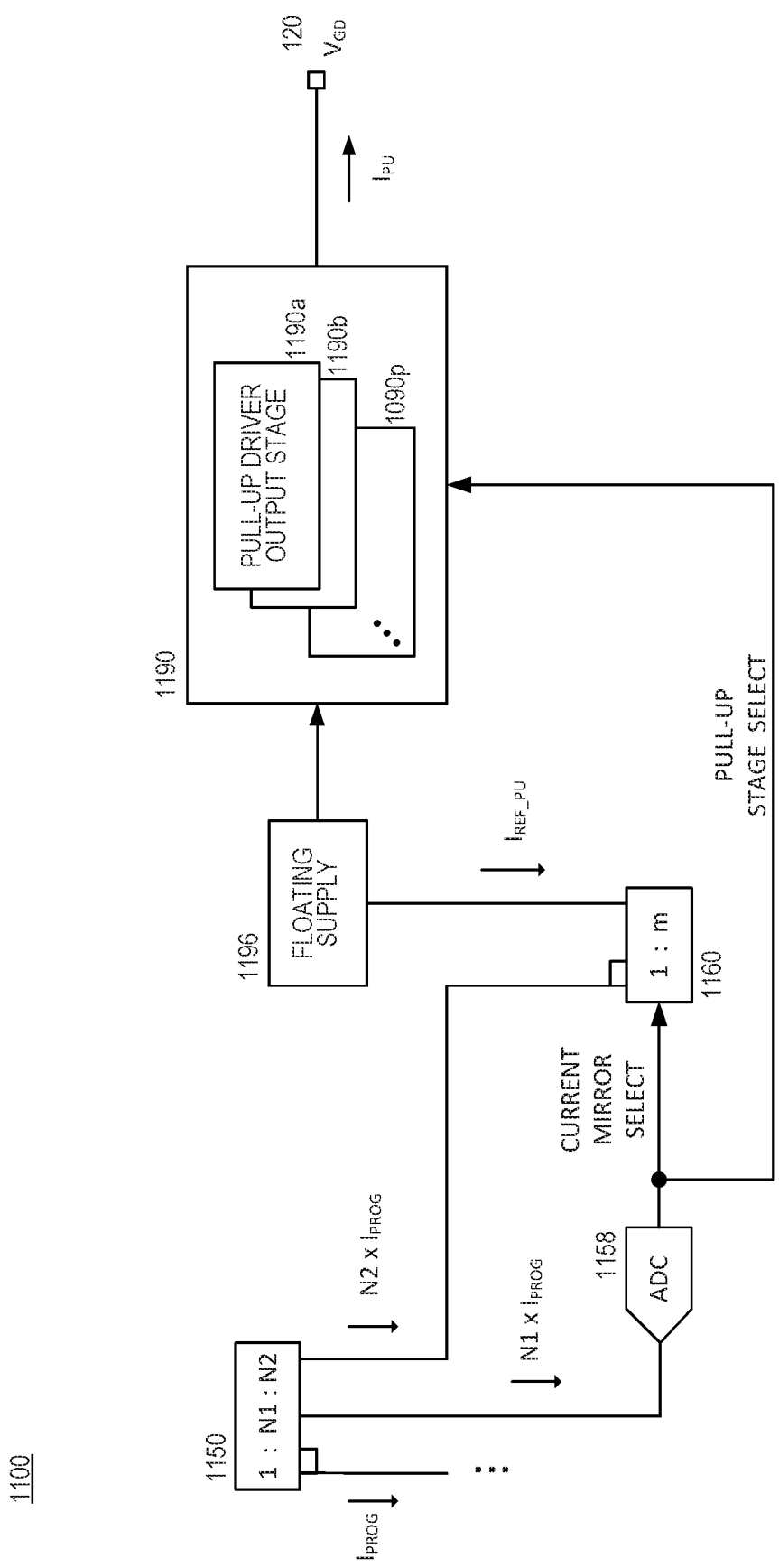
FIG. 11 illustrates current-mode gate driver circuitry that includes multiple output stage sub-circuits which may be individually enabled to set an output current level.

FIG. 11 illustrates a current-mode gate driver 1100 that includes a pull-up driver output stage 1190 having multiple sub-circuits 1190a, 1190b . . . 1190p. The pull-up current level $I_{PU}$ may be determined based upon some number of pull-up output stage sub-circuits that are enabled. The number of enabled sub-circuits may be set according to a reference current $I_{PROG}$, as described in the previous embodiments. (For ease of illustration, provision of the reference current $I_{PROG}$ is not illustrated in FIG. 11, but it should be understood that the techniques described previously may be used for setting the current level $I_{PROG}$.) While the circuit of FIG. 11 shows only the pull-up portion of an output driver stage, the circuitry may be readily extended to include pull-down circuitry.

The current-mode gate driver 1100 additionally includes a first current mirror 1150, an analog-to-digital converter (ADC) 1158, a floating supply 1196, and a second current mirror 1160. The first current mirror 1150 provides current translation ratios of N1 and N2. A current $N1 \times I_{PROG}$ is output from the first current mirror 1150 and provided to the ADC 1158. A current $N2 \times I_{PROG}$ is output from the first current mirror 1150 and provided to the second current mirror 1160. The second current mirror 1160 has a variable current translation ratio 1:m, and provides the pull-up reference current $I_{REF\_PU}$ to the floating supply 1196. The ADC 1158 digitizes the reference current $I_{PROG}$ and supplies digital values to the second current mirror 1160 and the pull-up driver output stage 1190.

In a first sub-embodiment, the second current mirror 1160 sets the current translation ratio m such that the pull-up reference current $I_{REF\_PU}$ is at a desired value, or at least within a desired range. Such a desired current may be determined based upon a desired current that flows through each of the pull-up driver output stage sub-circuits 1190a, 1190b, . . . 1190p. Accordingly, the value m may be inversely related to the current mirror select (digital) signal provided from the ADC 1158. In a second sub-embodiment, the reference current $I_{REF\_PU}$ may be set to a fixed value by an internal current source (not shown for ease of illustration). For such an embodiment, neither the second current mirror 1160 nor the N2 output branch of the first current mirror 1150 is necessary.

The pull-up driver output stage 1190 inputs a pull-up stage select signal and uses this (digital) signal to determine how many sub-circuits 1190a, 1190b, . . . 1190p to enable. For example, the pull-up driver output stage 1190 may include 16 sub-circuits. When the reference current $I_{PROG}$ is at (or below) a minimum value within its expected range, the ADC 1158 may output a pull-up stage select signal of 0 and the pull-up driver output stage 1190 may enable only one of its sub-circuits. A pull-up current $I_{PU}=I_{REF\_PU}$ will be provided to the gate-drive output terminal 120. When the reference current $I_{PROG}$ is at (or above) a maximum value within its expected range, the ADC 1158 may output a pull-up stage select signal of 15 and the pull-up driver output stage 1190 may enable all 16 of its sub-circuits. With a select signal of 15, a maximum pull-up current of $I_{PU}=15*I_{REF\_PU}$ will be provided to the gate-drive output terminal 120.

In an exemplary embodiment, the floating supply 1196 may be implemented using circuitry similar to that illustrated in FIG. 10. A controlled gate-to-source voltage may be available to each of the pull-up driver output stage sub-circuits 1190a, 1190b, . . . 1190p. Each of the sub-circuits includes a pre-driver, such as the pre-driver 1084 of FIG. 10. The pull-up stage select signal may be provided to a 4-to-16 multiplexor (not shown for ease of illustration) within the pull-up driver output stage 1190. The outputs of such a multiplexor are used as control inputs for the pre-drivers.

Method for Voltage Conversion Using Interleaved Half Bridges

Figure 12:
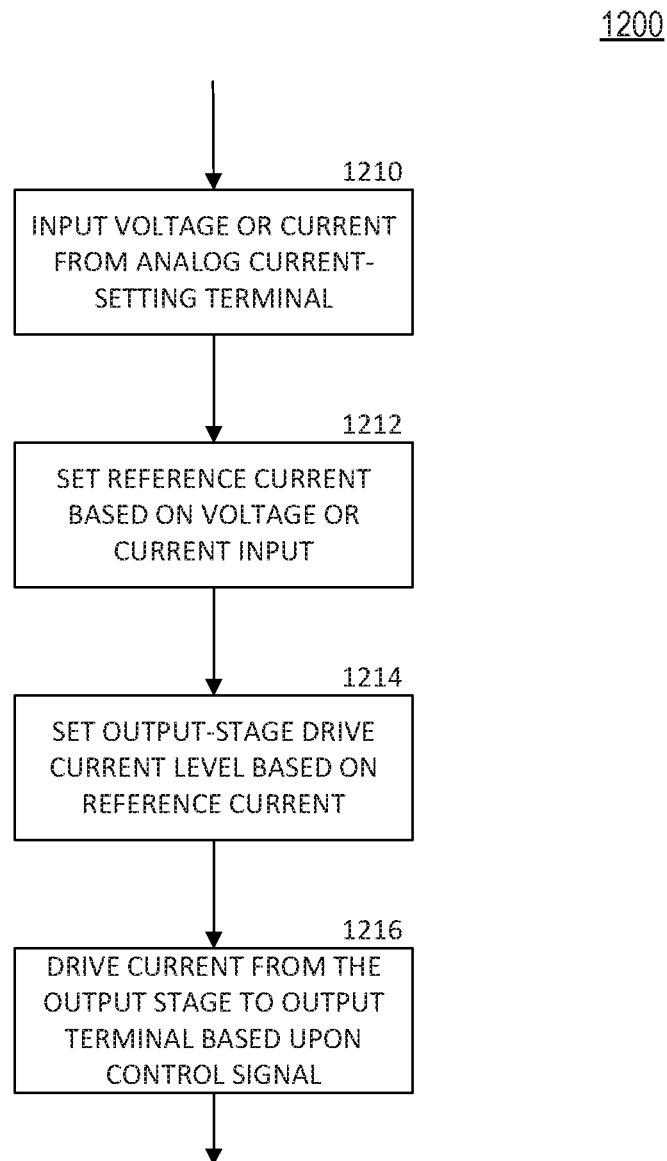
FIG. 12 illustrates a method for providing a current-based gate drive signal for a power device.

FIG. 12 illustrates a method 1200 for providing a gate drive current based upon a voltage or current at an analog current-setting terminal. This method may be implemented within a current-mode gate driver circuit, such as the current-mode gate driver circuit 100 illustrated in FIG. 1 and the variant circuits described previously. The voltage or current at the analog current-setting terminal takes a value within a continuous range of values, and that value is used for determining the current level that is driven.

The method 1200 begins with a step of inputting 1210 a voltage or current level at the analog current-setting terminal. A reference current level is set 1212 to follow the input voltage or current level. A current level for an output stage of the gate driver is then set 1214 based upon the reference current level. The output stage may be a pull-up output stage, a pull-down output stage, or include both pull-up and pull-down output stages. The output stage is then switched 1216, such that the output current level is driven to an output terminal of the gate driver, based upon a control signal provided at an input control terminal. For example, a pull-up current level of a pull-up output stage may be sourced to the output terminal when the input control signal indicates that drive current should be sourced to turn on a power device such as the MOSFET $Q_1$ of FIG. 1. Conversely, a pull-down current level of a pull-down output stage may be sunk from the output terminal when the input control signal indicates that drive current should be sunk from the output terminal so as to turn off a power device such as the MOSFET $Q_1$ of FIG. 1.

An embodiment of a current-mode gate driver circuit includes an analog current-setting terminal, an adjustable current generator, an output terminal, an output stage, and an input control terminal. The adjustable current generator has an input coupled to the analog current-setting terminal and is configured to generate a reference current level that follows a voltage or current level at the analog current-setting terminal. The output terminal is configured for coupling to a gate terminal of a power device. The output stage is configured to drive the output terminal based upon the reference current level. The input control terminal is configured to provide switching for the output stage.

According to any embodiment of the current-mode gate driver circuit, the output stage may include a pull-up current mirror coupled in series with a pull-up control switch, a pull-down pull-up current mirror coupled in series with a pull-down control switch, or both a pull-up current mirror coupled in series with a pull-up control switch and a pull-down pull-up current mirror coupled in series with a pull-down control switch. The pull-up switch device provides a switchable connection between the pull-up current mirror and the output terminal. The pull-down switch device provides a switchable connection between the pull-down current mirror and the output terminal. The pull-up current mirror is configured to source current, to the output terminal and through the pull-up switch device, based upon the reference current level. The pull-down current mirror is configured to sink current, from the output terminal and through the pull-down switch device, based upon the reference current level.

According to any embodiment of the current-mode gate driver circuit, the adjustable current generator provides, to the output stage, a pull-up reference current that is a factor of N greater than the reference current.

According to any embodiment of the current-mode gate driver circuit, the adjustable current generator provides, to the output stage, a pull-down reference current that is a factor of M greater than the reference current. The factors M and N may be the same or different.

According to any embodiment of the current-mode gate driver circuit, a pull-up current mirror within the output stage is configured to source current to the output terminal that is a factor of K greater than a pull-up reference current.

According to any embodiment of the current-mode gate driver circuit, a pull-down current mirror within the output stage is configured to sink current from the output terminal that is a factor of H greater than a pull-down reference current.

According to any embodiment of the current-mode gate driver circuit, the adjustable current generator includes an amplifier and an adjustable current generator switch. The amplifier has a non-inverting input, an inverting input and an amplifier output. The adjustable current generator switch has a control terminal coupled to the amplifier output, a first terminal coupled to an inverting input of the amplifier, and a second terminal. A current having the reference current level flows through the adjustable current switch. In a first sub-embodiment, the non-inverting input is coupled to a reference voltage, the inverting input is coupled to the analog current-setting terminal which is configured for coupling to an external programming resistor, and the reference current level is set based on the reference voltage and a resistance of the external programming resistor. In a second sub-embodiment, the inverting input is coupled to a ground via a programming resistor, the non-inverting input is coupled to the analog current-setting terminal which is configured for coupling to an external reference voltage, and the reference current level is based on the external reference voltage and a resistance of the programming resistor.

According to any embodiment of the current-mode gate driver circuit, the analog current-setting terminal is configured for connection to an external current source, and the reference current level is set by a current of the external current source.

According to any embodiment of the current-mode gate driver circuit, the analog current-setting terminal is configured to input a pulse-width-modulated (PWM) signal. In a first sub-embodiment, a frequency-to-current converter is configured to convert a frequency of the PWM signal into a current having the reference current level. In a second sub-embodiment, a duty cycle of the PWM signal is converted into a current having the reference current level. The second sub-embodiment may further include a low-pass filter which filters the PWM signal before it is converted into the current.

According to any embodiment of the current-mode gate driver circuit, the output stage includes a plurality of pull-up switch devices and an analog to digital converter (ADC). The ADC is configured to output a digital value based upon the reference current level and the digital value determines a number of the pull-up switch devices to activate.

According to any embodiment of the current-mode gate driver circuit, the adjustable current generator comprises a first switch through which the reference current flows, thereby generating a reference voltage across gate and source terminals of the first switch. The output stage comprises a power switch configured such that a power switch voltage across gate and source terminals of the power switch determines a drive current level of the output stage. The power switch voltage follows the reference voltage.

A current-mode gate driver system includes a controller, a power device, and a current-mode gate driver. The controller is configured to provide a gate current control parameter at a control output, wherein the current control parameter is at least one of a control voltage, a control current, or a control resistance. The power device includes a gate terminal that controls conduction between a first power device terminal and a second power device terminal. The current-mode gate driver circuit may comprise any of the embodiments of the current-mode gate driver circuits described above.

An embodiment of a method for driving a gate is provided within a current-mode gate driver circuit. The current-mode gate driver circuit comprises an analog current-setting terminal, an adjustable current generator, an output terminal for coupling to a gate terminal of a power device, an output stage, and an input control terminal for switching the output stage. The method includes inputting a voltage or current level at the analog current-setting terminal. A reference current level is set that follows the input voltage or current level. A current drive level for the output stage is set based upon the reference current level. A current having the current drive level is driven from the output stage to the output terminal. The output stage is switched based upon a control signal provided at the input control terminal.

As used herein, the terms "having," "containing," "including," "comprising," and the like are open-ended terms that indicate the presence of stated elements or features, but do not preclude additional elements or features. The articles "a," "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A current-mode gate driver circuit, comprising:
    an analog current-setting terminal configured to input an analog electrical signal from a source external to the current-mode gate driver circuit;
    an adjustable current generator having an input coupled to the analog current-setting terminal and configured to generate a reference current level that follows a voltage or current level at the analog current-setting terminal;
    an output terminal for coupling to a gate terminal of a power device;
    an output stage configured to drive the output terminal with a current drive level that is based upon the reference current level, the output stage comprising:
        a first current mirror configured to source current to the output terminal, based upon the reference current level; and/or
        a second current mirror configured to sink current from the output terminal, based upon the reference current level; and
    an input control terminal for switching the output stage.

2. The current-mode gate driver circuit of claim 1, wherein the output stage comprises both the first current mirror and the second current mirror.

3. The current-mode gate driver circuit of claim 2, wherein the adjustable current generator is configured to provide, to the first current mirror, a first reference current that is a factor of N greater than the reference current, and wherein the adjustable current generator is configured to provide, to the second current mirror, a second reference current that is a factor of M greater than the reference current.

4. The current-mode gate driver circuit of claim 3, wherein M and N are different.

5. The current-mode gate driver circuit of claim 2, wherein the first current mirror is configured such that the current sourced to the output terminal is a factor of K greater than the first reference current, and wherein the second current mirror is configured such that the current sunk from the output terminal is a factor of H greater than the second reference current.

6. The current-mode gate driver circuit of claim 1, wherein the adjustable current generator comprises:
    an amplifier having a non-inverting input, an inverting input and an amplifier output; and
    an adjustable current generator switch having a control terminal coupled to the amplifier output, a first terminal coupled to an inverting input of the amplifier, and a second terminal,
    wherein a current having the reference current level flows through the adjustable current switch.

7. The current-mode gate driver circuit of claim 6, wherein the non-inverting input is coupled to a reference voltage, the inverting input is coupled to the analog current-setting terminal which is configured for coupling to an external programming resistor, and the reference current level is set based on the reference voltage and a resistance of the external programming resistor.

8. The current-mode gate driver circuit of claim 6, wherein the inverting input is coupled to a ground via a programming resistor, the non-inverting input is coupled to the analog current-setting terminal which is configured for coupling to an external reference voltage, and the reference current level is based on the external reference voltage and a resistance of the programming resistor.

9. The current-mode gate driver circuit of claim 1, wherein the analog current-setting terminal is configured for connection to an external current source, and the reference current level is set by a current of the external current source.

10. The current-mode gate driver circuit of claim 1, wherein the analog current-setting terminal is configured to input a pulse-width-modulated (PWM) signal having a first frequency, and wherein the adjustable current generator includes a frequency-to-current converter configured to convert the first frequency into a current having the reference current level.

11. The current-mode gate driver circuit of claim 1, wherein the analog current-setting terminal is configured to input a pulse-width-modulated (PWM) signal having a constant frequency and a first duty cycle, and wherein the adjustable current generator is configured to convert the first duty cycle into a current having the reference current level.

12. The current-mode gate driver circuit of claim 11, wherein the adjustable current generator includes a low-pass filter which filters the PWM signal and outputs a programming voltage or a programming current which determines the reference current level.

13. The current-mode gate driver circuit of claim 1, wherein the output stage comprises an analog to digital converter (ADC) configured to output a digital value based upon the reference current level, and wherein the digital value is provided to the first current mirror and/or the second current mirror.

14. The current-mode gate driver circuit of claim 1, wherein the adjustable current generator comprises a first switch through which the reference current flows, thereby generating a reference voltage across gate and source terminals of the first switch, and wherein the output stage comprises a power switch configured such that a power switch voltage across gate and source terminals of the power switch determines a drive current level of the output stage, and the power switch voltage follows the reference voltage.

15. The current-mode gate driver circuit of claim 1, wherein the reference current level generated by the adjustable current generator is based upon the voltage level at the analog current-setting terminal.

16. A current-mode gate driver system, comprising:
a controller configured to provide a gate current control parameter at a control output, the current control parameter being one or more of a control voltage, a control current, or a control resistance;
a power device comprising a gate terminal that controls conduction between a first power device terminal and a second power device terminal; and
a current-mode gate driver circuit comprising:
an analog current-setting terminal coupled to the control output;
an adjustable current generator having an input coupled to the analog current-setting terminal and configured to generate a reference current level that follows a voltage or current level at the analog current-setting terminal;
an output terminal for coupling to the gate terminal of a power device;
an output stage configured to drive the output terminal with a current drive level that is based upon the reference current level, the output stage comprising:
a first current mirror configured to source current to the output terminal, based upon the reference current level; and/or
a second current mirror configured to sink current from the output terminal, based upon the reference current level; and
an input control terminal for switching the output stage.

17. The current-mode gate driver system of claim 16, wherein the output stage of the current-mode gate driver circuit comprises both the first current mirror and the second current mirror.

18. The current-mode gate driver system of claim 17, wherein the adjustable current generator of the current-mode gate driver circuit is configured to provide, to the first current mirror, a first reference current that is a factor of N greater than the reference current, and wherein the adjustable current generator of the current-mode gate driver circuit is configured to provide, to the second current mirror, a second reference current that is a factor of M greater than the reference current.

19. A method within a current-mode gate driver circuit that comprises an analog current-setting terminal configured to input an analog electrical signal from a source external to the current-mode gate driver circuit, an adjustable current generator, an output terminal for coupling to a gate terminal of a power device, an output stage, and an input control terminal for switching the output stage, the method comprising:
inputting a voltage level at the analog current-setting terminal;
setting a reference current level that follows the input voltage level;
setting a current drive level for the output stage based upon the reference current level;
driving a current having the current drive level from the output stage to the output terminal, by sourcing current to the output terminal based upon the reference current level and/or sinking current from the output terminal based upon the reference current level; and
switching the output stage based upon a control signal provided at the input control terminal.

20. A current-mode gate driver circuit, comprising:
an analog current-setting terminal configured to input an analog electrical signal from a source external to the current-mode gate driver circuit;
an adjustable current generator having an input coupled to the analog current-setting terminal and configured to generate a reference current level based upon a voltage level at the analog current-setting terminal;
an output terminal for coupling to a gate terminal of a power device;
an output stage configured to drive the output terminal with a current drive level that is based upon the reference current level, the output stage comprising:
a first current mirror configured to source current to the output terminal, based upon the reference current level; and/or
a second current mirror configured to sink current from the output terminal based upon the reference current level; and
an input control terminal for switching the output stage.

* * * * *